US010186599B1

(12) United States Patent
Fan et al.

(10) Patent No.: US 10,186,599 B1
(45) Date of Patent: Jan. 22, 2019

(54) FORMING SELF-ALIGNED CONTACT WITH SPACER FIRST

(71) Applicants:International Business Machines Corporation, Armonk, NY (US); GLOBALFOUNDRIES Inc., Grand Cayman (KY); SAMSUNG ELECTRONICS CO., LTD., Gyeonggi-do (KR)

(72) Inventors: Su Chen Fan, Cohoes, NY (US); Andrew M. Greene, Albany, NY (US); Sean Lian, Slingerlands, NY (US); Balasubramanian Pranatharthiharan, Watervliet, NY (US); Mark V. Raymond, Schenectady, NY (US); Ruilong Xie, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/655,547

(22) Filed: Jul. 20, 2017

(51) Int. Cl.
| | |
|---|---|
| *H01L 21/82* | (2006.01) |
| *H01L 29/66* | (2006.01) |
| *H01L 21/033* | (2006.01) |
| *H01L 21/768* | (2006.01) |
| *H01L 21/285* | (2006.01) |
| *H01L 29/49* | (2006.01) |
| *H01L 29/51* | (2006.01) |

(52) U.S. Cl.
CPC .... *H01L 29/66583* (2013.01); *H01L 21/0332* (2013.01); *H01L 21/0337* (2013.01); *H01L 21/28518* (2013.01); *H01L 21/28568* (2013.01); *H01L 21/76897* (2013.01); *H01L 29/6656* (2013.01); *H01L 29/4966* (2013.01); *H01L 29/517* (2013.01); *H01L 29/665* (2013.01)

(58) Field of Classification Search
CPC ..... H01L 21/823437; H01L 21/823431; H01L 27/0886
See application file for complete search history.

(56) References Cited

U.S. PATENT DOCUMENTS

| | | | |
|---|---|---|---|
| 8,440,533 B2 | 5/2013 | Toh et al. | |
| 8,637,359 B2 | 1/2014 | Chang et al. | |
| (Continued) | | | |

OTHER PUBLICATIONS

K. Vaidyanathan et al., "Rethinking ASIC design with next generation lithography and process integration," Proc. of SPIE, vol. 8684, Mar. 2013, 86840C (15 pages).

*Primary Examiner* — Mark Prenty
(74) *Attorney, Agent, or Firm* — Vazken Alexanian; Michael J. Chang, LLC

(57) ABSTRACT

Techniques for forming self-aligned contacts by forming gate sidewall spacers and gates before forming the contacts are provided. In one aspect, a method of forming self-aligned contacts includes the steps of: forming multiple gate sidewall spacers on a substrate; burying the gate sidewall spacers in a dielectric; forming gate trenches by selectively removing the dielectric from regions between the gate sidewall spacers in which gates will be formed; forming the gates in the gate trenches; forming contact trenches by selectively removing the dielectric from regions between the gate sidewall spacers in which the self-aligned contacts will be formed; and forming the self-aligned contacts in the contact trenches. A device structure having self-aligned contacts is also provided.

17 Claims, 6 Drawing Sheets

(56) References Cited

U.S. PATENT DOCUMENTS

| | | |
|---|---|---|
| 8,716,124 B2 | 5/2014 | Schultz |
| 8,927,378 B2 | 1/2015 | Pei et al. |
| 8,975,712 B2 | 3/2015 | Rashed et al. |
| 9,484,264 B1 * | 11/2016 | Basker .............. H01L 21/82343 |
| 9,570,397 B1 * | 2/2017 | Fan ...................... H01L 23/535 |
| 2013/0187171 A1 | 7/2013 | Guillorn et al. |
| 2013/0187236 A1 | 7/2013 | Xie et al. |
| 2014/0110817 A1 | 4/2014 | Bergendahl et al. |
| 2015/0069532 A1 | 3/2015 | Xie et al. |

\* cited by examiner

FORMING SELF-ALIGNED CONTACT WITH SPACER FIRST

FIELD OF THE INVENTION

The present invention relates to techniques for forming self-aligned contacts, and more particularly, to forming self-aligned contacts by forming gate sidewall spacers (e.g., using sidewall image transfer (SIT) technology) and gates before forming the contacts.

BACKGROUND OF THE INVENTION

An advantage of a replacement metal gate (or RMG) process is that the gate stack is protected from potentially damaging conditions, since it is placed at the end of the process. For instance, with RMG a sacrificial or dummy gate serves as a placeholder, e.g., to place the source and drain regions, etc. With conventional RMG process flows, a dielectric is then deposited around the dummy gate which permits the dummy gate to be replaced with a (replacement) metal gate stack. Source and drain contacts may then be formed between the metal gate stacks.

However, with scaled device technology, feature sizes are involved that are smaller than what can be reasonably achieved using direct patterning technology. For instance, gate-to-gate spacing is becoming so small that placing contacts in between the metal gate stacks is extremely challenging. Shrinking the size of the contacts is not always a viable option since that results in an increase in contact resistance.

Therefore, scalable process technology for forming self-aligned contacts would be desirable.

SUMMARY OF THE INVENTION

The present invention provides techniques for forming self-aligned contacts by forming gate sidewall spacers and gates before forming the contacts. In one aspect of the invention, a method of forming self-aligned contacts is provided. The method includes the steps of: forming multiple gate sidewall spacers on a substrate; burying the gate sidewall spacers in a dielectric; forming gate trenches by selectively removing the dielectric from regions between the gate sidewall spacers in which gates will be formed; forming the gates in the gate trenches; forming contact trenches by selectively removing the dielectric from regions between the gate sidewall spacers in which the self-aligned contacts will be formed; and forming the self-aligned contacts in the contact trenches.

In another aspect of the invention, a device structure is provided. The device structure includes: multiple gate sidewall spacers on a substrate; and gates and contacts self-aligned to the gates in regions between the gate sidewall spacers, wherein each of the gates comprises a metal gate, and wherein each of the contacts comprises a trench silicide.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for forming self-aligned contacts using a novel replacement metal gate (or RMG)

process flow leveraging sidewall image transfer (SIT) technology in which gate sidewall spacers are formed first, followed by RMG formation, and lastly contact metallization. Advantageously, SIT permits the patterning of sub-lithographic features (i.e., features smaller than what is achievable using direct patterning technology). SIT generally involves forming a mandrel(s), forming spacers on opposite sides of the mandrel, and then removing the mandrel selective to the spacers. The spacers are then used to pattern the underlying substrate. It is notable that for each patterned mandrel, there will be at least two spacers. Thus, SIT is often thought of as a pitch-doubling technique.

Figure 1:
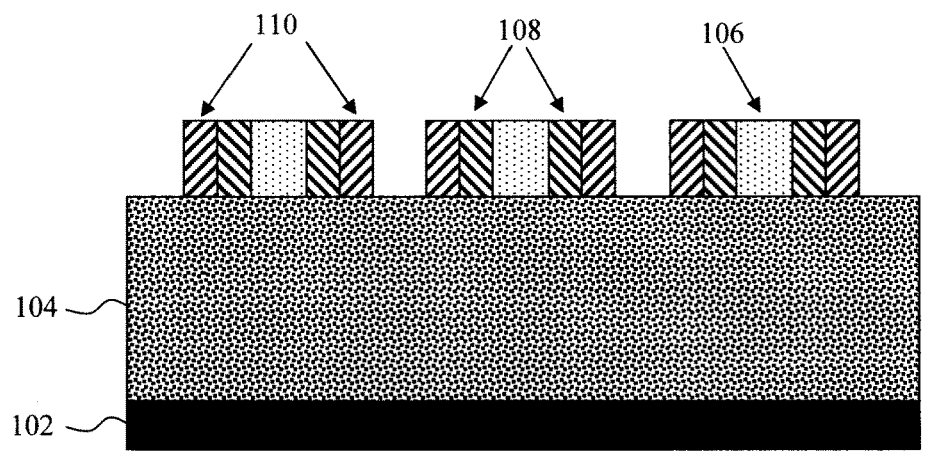
FIG. 1 is a cross-sectional diagram illustrating a starting platform for self-aligned contact formation that includes a substrate, a spacer material layer on the substrate, and composite spacer/mandrel sidewall image transfer (SIT) structures on the spacer material layer according to an embodiment of the present invention.

An exemplary embodiment of the present techniques is now described by way of reference to FIGS. 1-15. As shown in FIG. 1, the process begins with a substrate 102 on which the formation of metal gate stacks and contacts self-aligned to the metal gate stacks is desired. The particular configuration of the substrate 102 is not the primary focus of the present techniques, however one might envision that the substrate is a semiconductor substrate such as a bulk silicon (Si) wafer or a silicon on insulator (SOI) wafer that is prepared (using standard processes) to include an active area(s) containing a planar or non-planar (e.g., fin) channel material over which a metal gate stack is to be formed and source and drain region to which (the present self-aligned) contacts are to be formed.

As provided above, the first phase of the process involves first forming a plurality of gate sidewall spacers. These spacers are also referred to herein as a "sea of spacers." The gate sidewall spacers can be formed in a number of different ways, including via a standard direct patterning process. However, according to an exemplary embodiment, the gate sidewall spacers are formed using SIT. Further, in this exemplary embodiment, the spacers are formed from a suitable spacer material, such as silicon nitride (SiN), silicon carbon nitride (SiCN), silicon boron carbon nitride (SiBCN), silicon oxygen carbon nitride (SiOCN), and combinations thereof. Also, a composite SIT spacer configuration is used in this example. As will be described in detail below, a composite spacer SIT prevents rounding at the top corners of the spacers. Rounding at the top corner of the spacers causes a lot of width variation in the device structure. By comparison, using a composite spacers enables spacers to be formed having square shoulders.

Thus, as shown in FIG. 1, a spacer material layer 104 is formed on the substrate 102. As provided above, a suitable spacer material includes, but is not limited to, SiN, SiCN, SiBCN, and/or SiOCN. A composite spacer SIT structure is then formed on the spacer material layer 104. As shown in FIG. 1, the composite spacer SIT structure includes a plurality of mandrels 106, first spacers 108 on opposite sides of the mandrels 106, and second spacers 110 on a side of the first spacers 108 opposite the mandrels 106.

Mandrels 106 may be formed on the spacer material layer 104 by first blanket depositing a suitable mandrel material on the spacer material layer, and then patterning the mandrel material into the individual mandrels. Suitable mandrel materials include, but are not limited to, amorphous silicon (Si) and amorphous carbon. Amorphous Si films can be deposited, for example, using a physical or chemical vapor deposition process. Amorphous carbon films can be deposited, for example, using magnetron sputtering. Standard lithography and etching techniques can be employed to pattern the mandrels 106. For instance, as is known in the art, a patterned hardmask (e.g., silicon nitride (SiN)) (not shown) can be formed on the mandrel material masking the footprint and location of the mandrels 106. An etch through the patterned hardmask can then be performed to pattern the material in the individual mandrels 106. Suitable etching processes include, but are not limited to, an anisotropic etching process such as reactive ion etching (RIE). Following the etch, any remaining portions of the mandrel hardmask can be removed.

As described below, the mandrels 106 are removed selective to the first and second spacers 108 and 110, and the second spacers 110 are then removed selective to the first spacers. Thus, the mandrels 106, the first spacers 108, and the second spacers 110 are preferably all formed from different materials to permit selective removal. According to an exemplary embodiment, the first spacers 108 are formed from silicon dioxide ($SiO_2$), and the second spacers 110 are formed from a nitride (such as SiN), or vice versa. Removal of one spacer selective to the other can then be achieved easily using an oxide or nitride-selective etch.

The first spacers 108 can be formed by depositing the respective spacer material and then using standard lithography and etching techniques to form the individual spacers 108 on opposite sides of the mandrels 106. The same process can then be used to form the second spacers 110 on sides of the first spacers 108 opposite the mandrels 106. The result is the composite spacer configuration shown in FIG. 1.

Figure 2:
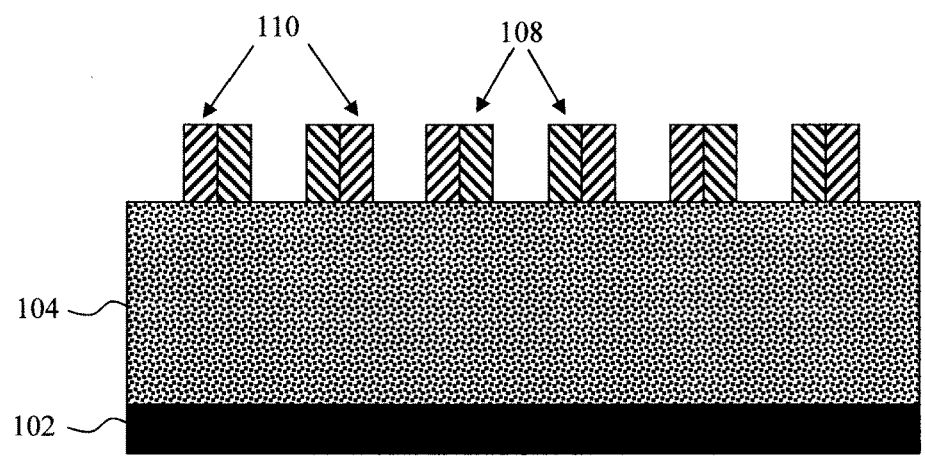
FIG. 2 is a cross-sectional diagram illustrating the mandrels having been removed selective to the composite SIT spacers according to an embodiment of the present invention.
Figure 3:
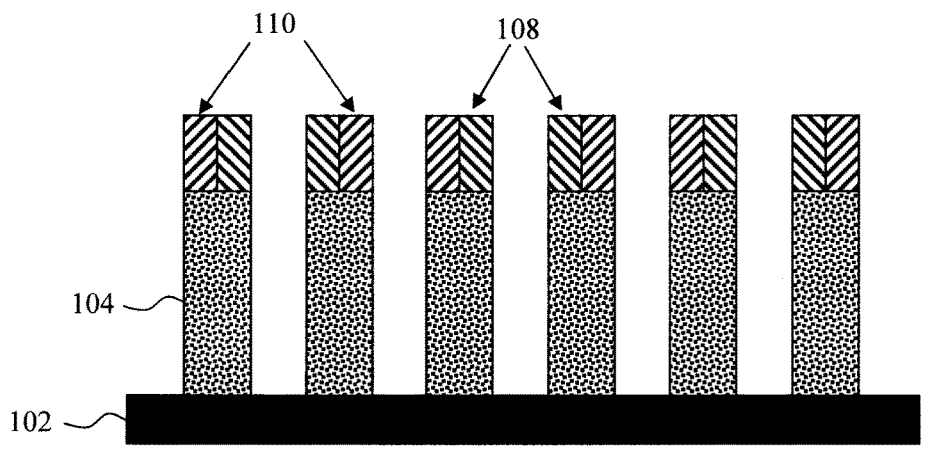
FIG. 3 is a cross-sectional diagram illustrating the composite SIT spacers having been used as a mask to pattern the spacer material layer according to an embodiment of the present invention.
Figure 4:
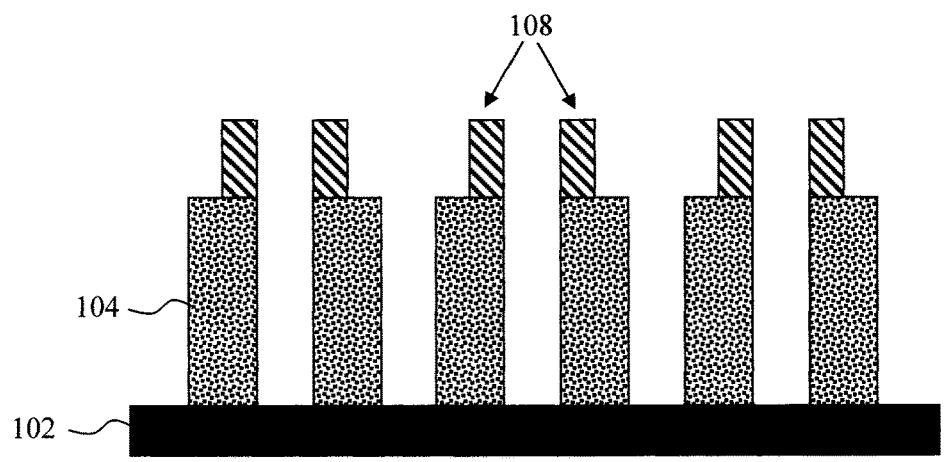
FIG. 4 is a cross-sectional diagram illustrating the second spacers having been removed selective to the first spacers according to an embodiment of the present invention.

Next, as shown in FIG. 2, the mandrels 106 are removed selective to the composite spacers (first/second spacers 108/110). According to an exemplary embodiment, the mandrels 106 are removed using an isotropic etching process, such as a selective wet etch. What remains after the mandrel removal is a composite SIT spacer over the spacer material layer 104. It is notable that use of a composite SIT spacer is merely an example, and embodiments are anticipated herein wherein SIT patterning is employed with a more standard single spacer/mandrel configuration.

The composite SIT spacers (i.e., first spacers 108/second spacers 110) are then used as a mask to pattern the spacer material layer 104. See FIG. 3. According to an exemplary embodiment, the spacer material layer is patterned using an anisotropic etching process stopping on the substrate 102. As provided above, a composite spacer prevents rounding at the top corners of the spacers, thereby enabling spacers to be formed having square shoulders.

The second spacers 110 are then removed selective to the first spacers 108. See FIG. 4. As provided above, the first and second spacers are preferably formed from different materials, such as an oxide versus a nitride, or vice versa. In that case, an oxide or nitride-selective etch can be used to remove the second spacers 110 vis-à-vis the first spacers 108. Removing the second spacers 110 permits a second etch of the spacer material layer 104 to be performed, further thinning the spacers.

Figure 5:
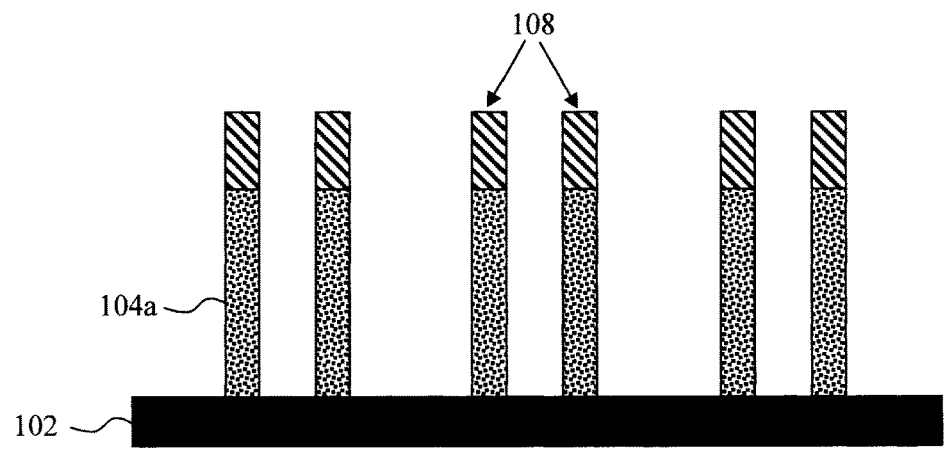
FIG. 5 is a cross-sectional diagram illustrating the first spacers having been used to further trim the spacer material layer into a plurality gate sidewall spacers according to an embodiment of the present invention.

Namely, as shown in FIG. 5, the first spacers 108 are then used to further trim the spacer material layer 104 into a plurality (i.e., sea of) gate sidewall spacers. The gate sidewall spacers formed from spacer material layer 104 will now be given the reference numeral 104a.

Figure 6:
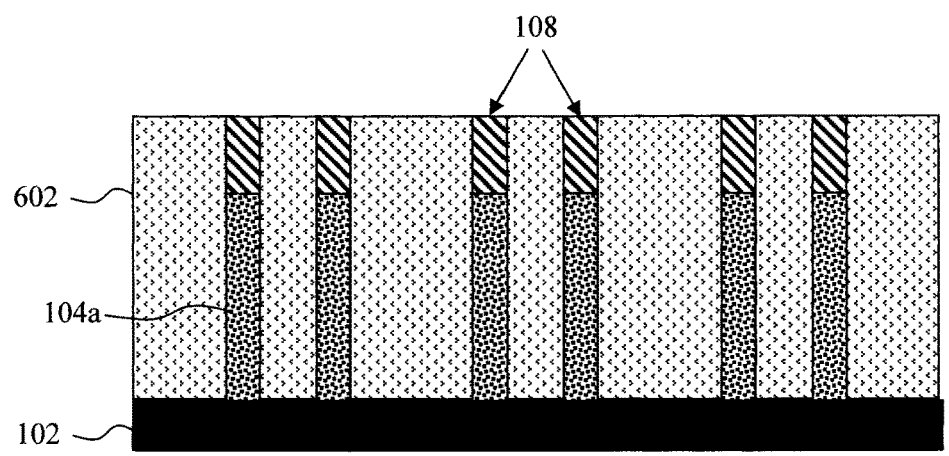
FIG. 6 is a cross-sectional diagram illustrating the gate sidewall spaces having been buried in a dielectric according to an embodiment of the present invention.
Figure 7:
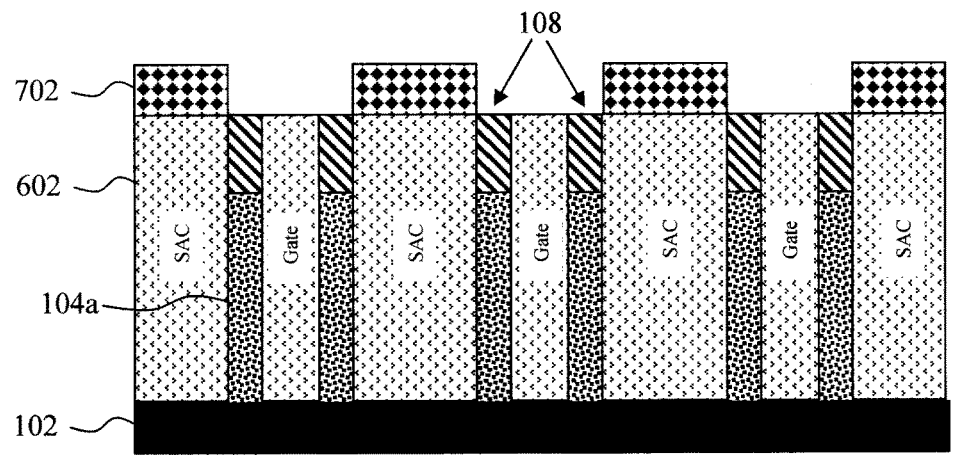
FIG. 7 is a cross-sectional diagram illustrating a mask having been formed over/covering regions between the gate sidewall spacers in which self-aligned contacts will be formed according to an embodiment of the present invention.
Figure 8:
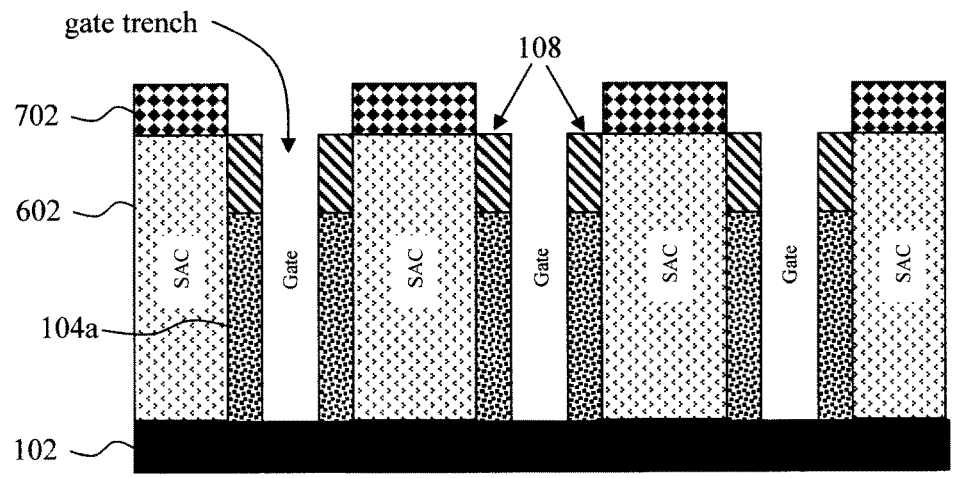
FIG. 8 is a cross-sectional diagram illustrating the mask having been used to permit selective removal of the dielectric from the regions between the gate sidewall spacers in which a replacement metal gate (RMG) will be formed resulting in gate trenches between the gate sidewall spacers according to an embodiment of the present invention.

Now that the gate sidewall spacers have been formed, the next phase in the process is to form the RMG. To do so, the gate sidewall spaces are buried in a dielectric 602 (see FIG. 6) and then selectively removing the dielectric 602 from regions between the gate sidewall spacers 104a in which the RMG will be formed (see FIGS. 7 and 8—described below). Suitable dielectrics include, but are not limited to, $SiO_2$. As shown in FIG. 6, following deposition the dielectric may be planarized (e.g., using a process such as chemical mechanical polishing or CMP with the first spacers 108 acting as an etch stop).

To permit selective removal of the dielectric 602 from regions between the gate sidewall spacers 104a in which the RMG will be formed, a mask 702 is formed over/covering regions between the gate sidewall spacers 104a in which self-aligned contacts will be formed. See FIG. 7. According to an exemplary embodiment, mask 702 is a nitride (e.g., SiN) hardmask. For clarity, the labels SAC (for self-aligned contact) and Gate are now being used in the figures to illustrate the regions between the gate sidewall spacers 104a in which the self-aligned contacts and gates will formed, respectively.

The mask 702 is then used to permit selective removal of the dielectric 602 from the regions between the gate sidewall spacers 104a in which the RMG will be formed. See FIG. 8. The mask 702 will protect the dielectric 602 present in the regions between the gate sidewall spacers 104a in which the self-aligned contacts will be formed. By way of example only, when the dielectric 602 is $SiO_2$, the dielectric 602 can be cleared from the RMG regions using an oxide-selective etch stopping on the substrate 102. By way of this process, gate trenches are effectively formed between the gate sidewall spacers 104a. See FIG. 8.

Figure 9:
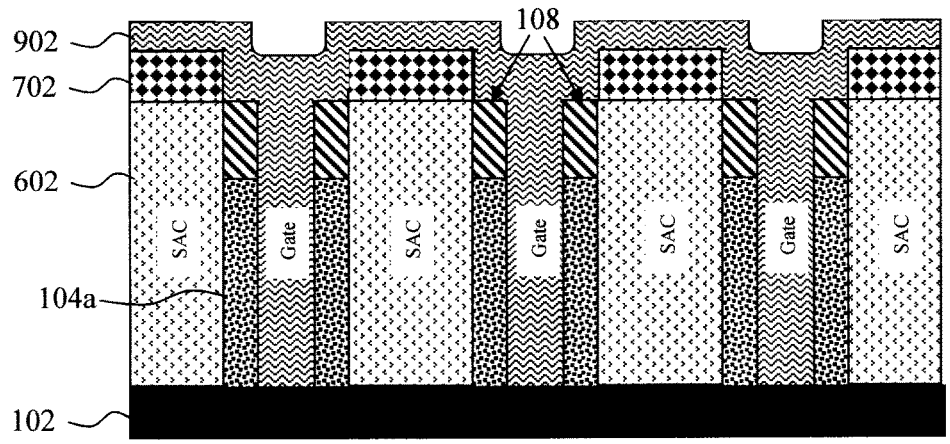
FIG. 9 is a cross-sectional diagram illustrating gate stack materials having been deposited into, and filling, the gate trenches according to an embodiment of the present invention.
Figure 10:
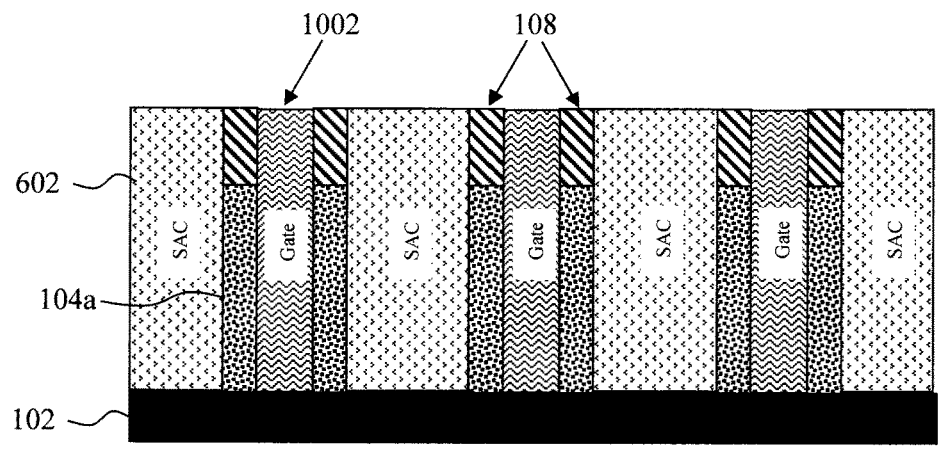
FIG. 10 is a cross-sectional diagram illustrating the gate stack material having been polished to form distinct gate stacks in the gate trenches according to an embodiment of the present invention.

As shown in FIGS. 9 and 10, RMGs are then formed in the gate trenches. Namely, as shown in FIG. 9, gate stack materials 902 are deposited into, and filling, the gate trenches. By way of example only, the gate stack materials can include a gate dielectric and a combination of workfunction and filler metal layers. For instance, the gate dielectric can be deposited into the gate trench, followed by the workfunction setting metal (on the gate dielectric) and then the filler metal (on the workfunction setting metal). Suitable gate dielectrics for a metal gate include, but are not limited to, high-κ materials such as hafnium oxide ($HfO_2$) and lanthanum oxide ($La_2O_3$). The term "high-κ" as used herein refers to a material having a relative dielectric constant κ which is much higher than that of silicon dioxide (e.g., a dielectric constant κ=25 for hafnium oxide rather than 4 for silicon dioxide). Suitable workfunction setting metals include, but are not limited to, n-type workfunction setting metals such as titanium nitride (TiN) and tantalum nitride (TaN), and p-type workfunction setting metals such as tungsten (W). Suitable filler metals include, but are not limited to, aluminum (Al). The gate stack materials are generically represented in the figures by layer 902.

As shown in FIG. 10, the gate stack material 902 can be polished using a chemical and/or mechanical polishing process (such as CMP). The result is distinct gate stacks 1002 having been formed in the gate trenches.

The self-aligned contacts will be formed in the regions between the gate sidewall spacers 104a on opposite sides of each of the gate stacks 1002. Each pair of the self-aligned contacts will be associated with the particular gate stack 1002 that is between that pair of contacts. Take for instance the situation where the self-aligned contacts are being formed to source and drain regions on opposite sides of each of the gate stacks 1002. In that case, the self-aligned contact/gate stack/self-aligned contact combination in adjacent regions between the gate sidewall spacers 104a will correspond to a common transistor. In order to achieve this configuration, every other gate stack 1002 is selectively removed. See FIGS. 11 and 12.

Figure 11:
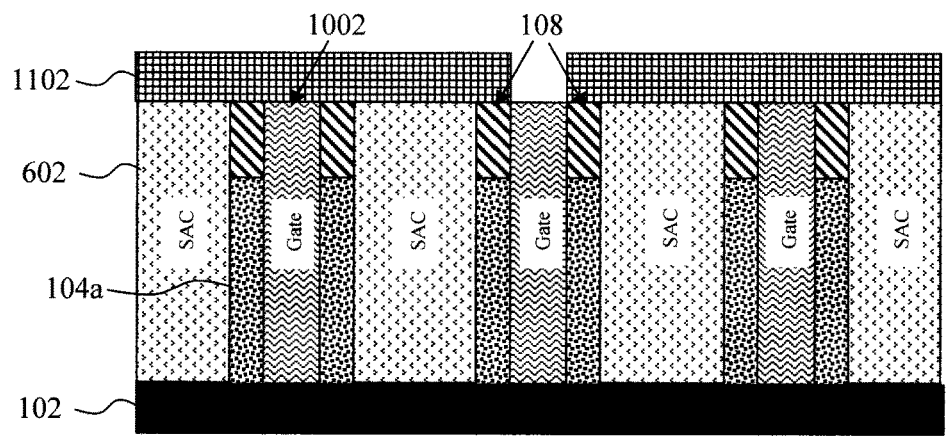
FIG. 11 is a cross-sectional diagram illustrating a mask having been formed selectively covering all but one or more of the gate stacks that are to be removed according to an embodiment of the present invention.
Figure 12:
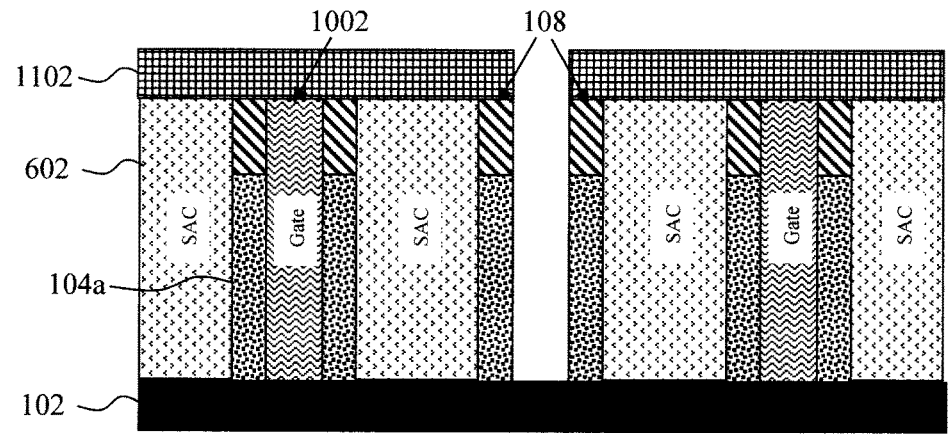
FIG. 12 is a cross-sectional diagram illustrating an etch through the mask having been performed to remove the exposed gate stack(s) according to an embodiment of the present invention.

As shown in FIG. 11, removal of select gate stacks 1002 can be achieved using a selective mask 1102 (e.g., a SiN hardmask) covering all but the gate stack(s) that are to be removed. Standard lithography and etching techniques can be used to form the mask 1102. An etch through the mask 1102 can then be performed to remove the exposed gate stack(s). See FIG. 12. The particular etch chemistry used can vary depending on the gate stack materials and it is possible that multiple etch steps may be needed to fully remove the gate metal(s), gate dielectric, etc.

Figure 13:
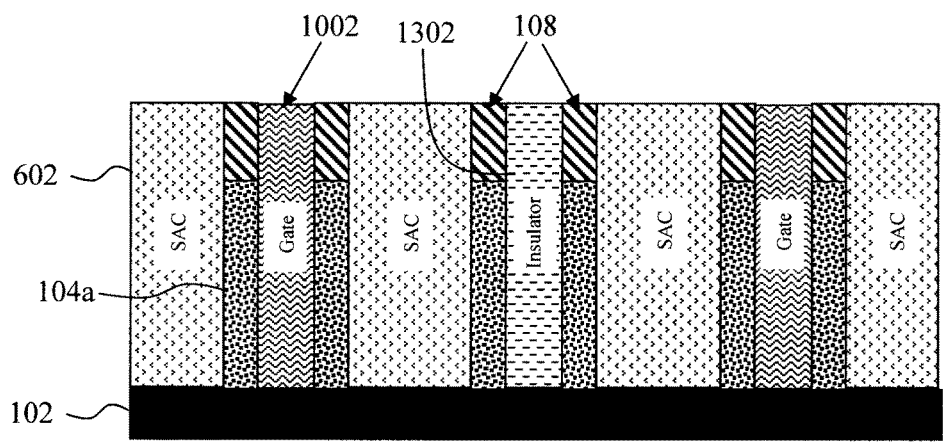
FIG. 13 is a cross-sectional diagram illustrating the region(s) between the gate sidewall spacers from which a gate stack has been removed having been filled with an insulator according to an embodiment of the present invention.
Figure 14:
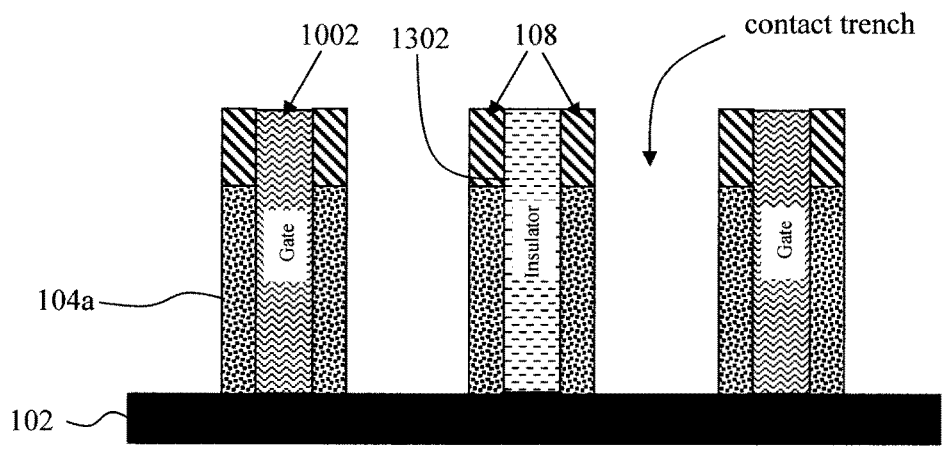
FIG. 14 is a cross-sectional diagram illustrating the dielectric having been removed selective to the metal gate stacks, forming a plurality of contact trenches between the gate stacks according to an embodiment of the present invention.
Figure 15:
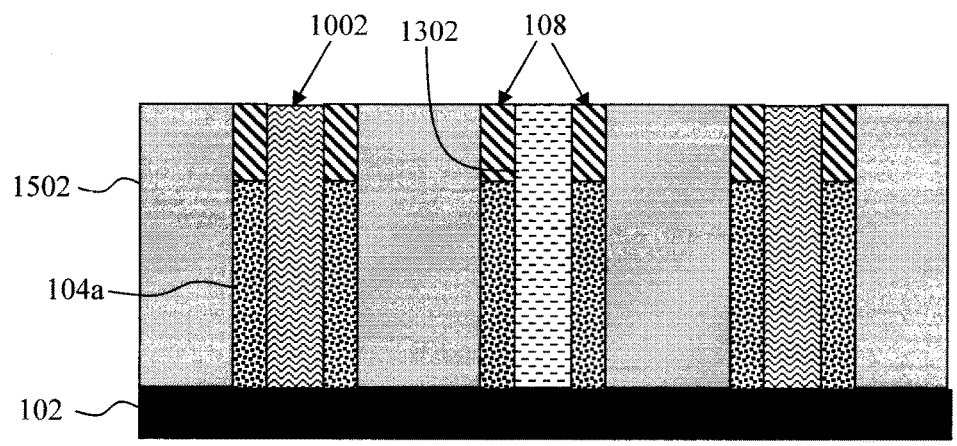
FIG. 15 is a cross-sectional diagram illustrating contacts having been formed in the contact trenches according to an embodiment of the present invention.

The region(s) between the gate sidewall spacers 104a from which a gate stack has been removed may then be filled with an insulator 1302, such as SiN. See FIG. 13. As shown in FIG. 13, a polish (e.g., using CMP) may then be performed to remove the mask 1102 and any excess insulator 1302.

Now that the gate sidewall spacers have been formed (first phase of the process) and the RMG has been formed (second phase of the process), the third phase of the process is now carried out to form the self-aligned metal contacts. See FIGS. 14 and 15. As highlighted above, the contacts will be formed in the regions between the gate sidewall spacers 104a on opposite sides of each of the gate stacks 1002. Thus, the contacts will be self-aligned to the gate stacks 1002.

To begin the contact formation process, the dielectric 602 is first removed selective to the metal gate stacks 1002. See FIG. 14. By way of example only, when the dielectric 602 is an oxide such as $SiO_2$, then an oxide-selective etching process may be employed. By removing the dielectric 602, a plurality of contact trenches are formed between the gate stacks 1002. See FIG. 14. Contacts 1502 are then formed in the contact trenches. According to an exemplary embodiment, the contacts 1502 are formed in the contact trenches from a trench silicide. By way of example only, a silicide metal or metals is/are deposited into the contact trenches. Silicide will form wherever the silicide metal is in contact with silicon (e.g., in the source and drain region regions of the substrate 102). Suitable silicide metals include, but are not limited to, nickel (Ni) (e.g., forming a nickel silicide (NiSi)). An anneal (e.g., at a temperature of from about 500 degrees Celsius (° C.) to about 800° C., and ranges therebetween) is then used to react the silicide metal with the substrate 102 to form a trench silicide (i.e., contacts 1502) within the contact trenches. Afterwards, any unreacted silicide metal can be removed.

Figure 16:
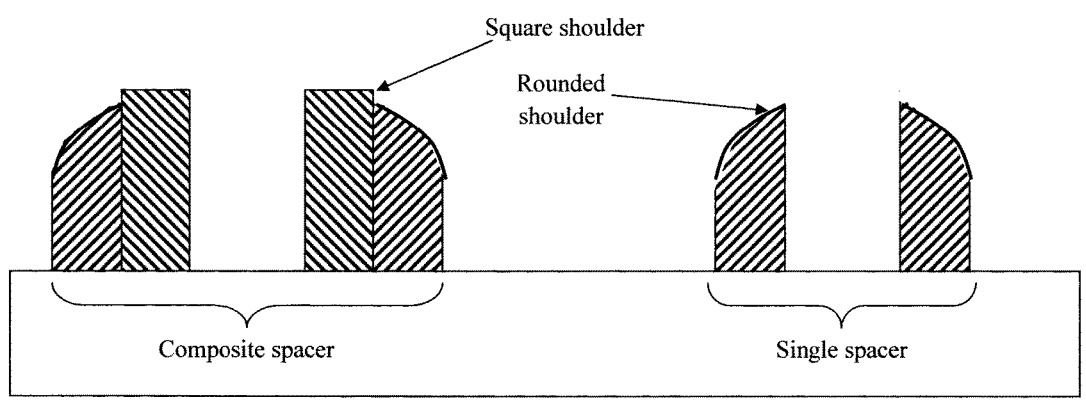
FIG. 16 is a cross-sectional diagram illustrating side-by-side examples of composite and single spacers according to an embodiment of the present invention.

As provided above, use of a composite spacer SIT prevents rounding at the top corners of the spacers, thereby enabling spacers to be formed having square shoulders. This concept is further illustrated in FIG. 16 which shows side-by-side examples of a composite spacer on the left and a single spacer on the right. In the case of the composite spacer, only the outer spacer experiences any rounding. The inner spacer advantageously has a square shoulder. By comparison, with the single spacer rounding is present at the upper corners. This rounding in the final spacer can undesirably cause device width variations.

Although illustrative embodiments of the present invention have been described herein, it is to be understood that the invention is not limited to those precise embodiments, and that various other changes and modifications may be made by one skilled in the art without departing from the scope of the invention.

What is claimed is:
1. A method of forming self-aligned contacts, the method comprising the steps of:
forming multiple gate sidewall spacers on a substrate;
burying the gate sidewall spacers in a dielectric;
forming gate trenches by selectively removing the dielectric from regions between the gate sidewall spacers in which gates will be formed;
forming the gates in the gate trenches;

forming contact trenches by selectively removing the dielectric from regions between the gate sidewall spacers in which the self-aligned contacts will be formed; and forming the self-aligned contacts in the contact trenches.

2. The method of claim 1, further comprising the steps of:
forming a spacer material layer on the substrate; and
patterning the spacer material layer to form the gate sidewall spacers on the substrate.

3. The method of claim 2, wherein sidewall image transfer (SIT) is used to pattern the spacer material layer to form the gate sidewall spacers on the substrate.

4. The method of claim 3, further comprising the steps of:
forming mandrels on the spacer material layer;
forming composite SIT spacers on opposite sides of the mandrels, wherein the composite SIT spacers comprise i) first spacers on opposite sides of the mandrels and ii) second spacers on a side of the first spacers opposite the mandrels.

5. The method of claim 4, further comprising the steps of:
removing the mandrels selective to the composite spacers;
using the composite spacers to pattern the spacer material layer;
selectively removing the second spacers; and
using the first spacers to pattern the spacer material layer.

6. The method of claim 1, further comprising the step of:
forming a mask covering the regions between the gate sidewall spacers in which the self-aligned contacts will be formed prior to selectively removing the dielectric from the regions between the gate sidewall spacers in which gates will be formed.

7. The method of claim 1, wherein the gates comprise replacement metal gates, and wherein the step of forming the gates in the gate trenches comprises the steps of:

depositing a gate dielectric into the gate trenches;
depositing a workfunction setting metal on the gate dielectric; and
depositing a filler metal on the workfunction setting metal.

8. The method of claim 7, wherein the gate dielectric comprises a high-κ material selected from the group consisting of: hafnium oxide and lanthanum oxide.

9. The method of claim 7, wherein the workfunction setting metal is selected from the group consisting of: titanium nitride, tantalum nitride, and tungsten.

10. The method of claim 7, wherein the filler metal comprises aluminum.

11. The method of claim 1, wherein the self-aligned contact comprises a trench silicide.

12. The method of claim 11, wherein the trench silicide comprises nickel silicide.

13. The method of claim 1, further comprising the step of:
selectively removing at least one of the gates.

14. The method of claim 13, further comprising the step of:
selectively removing every other one of the gates.

15. The method of claim 13, further comprising the step of:
masking all but the gates that are to be selectively removed.

16. The method of claim 13, further comprising the step of:
filling the gate trenches from which at least one of the gates have been selectively removed with an insulator.

17. The method of claim 16, wherein the insulator comprises a nitride material.

* * * * *